US006838920B1

(12) United States Patent
Pradhan

(10) Patent No.: US 6,838,920 B1
(45) Date of Patent: Jan. 4, 2005

(54) ENVELOPING CURVES GENERATOR CIRCUIT

(75) Inventor: Pravas Pradhan, Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/383,389

(22) Filed: Mar. 7, 2003

Related U.S. Application Data

(60) Provisional application No. 60/364,348, filed on Mar. 13, 2002.

(51) Int. Cl.[7] .............................................. H03K 3/356
(52) U.S. Cl. ........................ 327/199; 327/208; 327/209
(58) Field of Search ................................ 327/199, 208, 327/209, 210, 214, 215, 218, 219, 222; 326/26, 27

(56) References Cited

U.S. PATENT DOCUMENTS 6,208,186 B1 * 3/2001 Nair ............................ 327/199
6,489,810 B2 * 12/2002 Ferrant ........................ 326/104
6,570,406 B2 * 5/2003 Tang et al. .................... 326/86

* cited by examiner

Primary Examiner—Tuan T. Lam
(74) Attorney, Agent, or Firm—Cesari and McKenna, LLP

(57) ABSTRACT

An enveloping curve generator that guarantees one curve will overlap another when both are going high and the other overlaps the first when both are going low. When the input goes high, one steering FET is turned off and the other directs the input signal to drive an output high. That output going high after a delay drive the second output high. The second output being high latches the states of the two outputs high. When the input goes low, the off FET is turned on and the on FET is turned off. The input signal is directed to drive the second output low and after a delay the first output is driven low. The first output going low latches the states of the two outputs low.

7 Claims, 6 Drawing Sheets

BASIC CIRCUIT

BASIC CIRCUIT

EXTENSION TO BASIC CIRCUIT

EXTENSION TO BASIC CIRCUIT

EXTENSION TO BASIC CIRCUIT

EXTENSION TO BASIC CIRCUIT

ENVELOPING CURVES GENERATOR CIRCUIT

CROSS-REFERENCE TO RELATED APPLICATIONS

The present application claims the benefit of U.S. Provisional Patent Application Ser. No. 60/364,348, which was filed on Mar. 13, 2002, and of common inventorship and title with the present application, and which provisional application is hereby incorporated herein by reference.

BACKGROUND OF THE INVENTION

1. Field of the Invention

The present invention relates to signal generation circuitry, and more particularly to circuitry that generates signal profiles or curves guaranteed to envelop other generated signal curves even when variations of chip processing, voltage and/or temperature are included.

2. Background Information

There are circuit design problems that have been addressed by designers since electrical/electronics circuitry has existed. One such problem is found in virtually all push-pull, totem-pole or cascaded drivers where one transistor is turned on driving an output in one direction while a second transistor is turned off that had driven the output in the opposite direction. If there is an overlap where, for even a short time both transistors are on or not quite turned off, the overlap may cause a current spike that may damage the circuitry or at least cause a "glitch" on the Vcc, ground or signal leads which may lead to improper circuit operation.

There is a continuing circuit design need to turn on or off one driver reliably before turning off or on another.

In other circuit applications staggered signals are necessary to ensure proper operation. For example, where secondary clocks with well defined and repeatable positive and negative phase delays are needed. In yet other applications the present invention will find advantageous applications to correct logic malfunctions in clocked circuitry where secondary clocks, derived from a primary clock, exhibit positive and negative phase delays with respect to each other and the primary clock.

Another important problem in circuit designs, including VLSI designs, is the occurrence of glitches that routinely occur in logic circuitry. Such glitches occur where a differential delay or latency occurs in a logic chain so that there is a cross over of logic curves causing an indeterminate logic state during the cross over period that can cause logic errors. By selecting overlapping curves such glitches and the indeterminate logic states can be eliminated.

The present invention is directed to providing circuitry that provides at least two signals where one signal reliably envelops the other for positive going signals and visa-versa for negative going signals.

SUMMARY OF THE INVENTION

In view of the foregoing background discussion, the present invention provides a latching enveloping curve generator where a high going input signal travels through a steering circuit or FET to drive a first output high. The high going input signal disables a second steering circuit or FET. That first output high, via a delay circuit, drives a second output high. That second output going high, in turn, latches the first output high.

When the input goes low, the first steering circuit is disabled and the low input signal via a second steering circuit drives the second output low. That low via another delay circuit drives the first output low after the delay. That first output going low, in turn, latches the second output low. The first output goes high before the second output goes high and the first out put goes low after the second output goes low, so that the first output envelops the second output when both go high and the second envelops the first output when both go low.

In a preferred embodiment a first inverter accepts the high input signal from the first steering FET and the inverter output is the first output. A second inverter is arranged with its input connected to the first output and its output connected to the output of the second steering FET. A third inverter is arranged with its input connected to the second inverter's output and its output is the second output. A fourth inverter is arranged with its input connected to the second output and its output connected to the input of the first inverter. The second and third inverters form the first delay circuit, and the fourth and first inverters form the second delay circuit.

In preferred embodiment, resistors may be placed in the output of one or more of the inverters and the steering FET's. The steering FETs are designed together with the inverter designs in a preferred embodiment to overcome the drive capability of the inverter outputs where a conflict exists.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
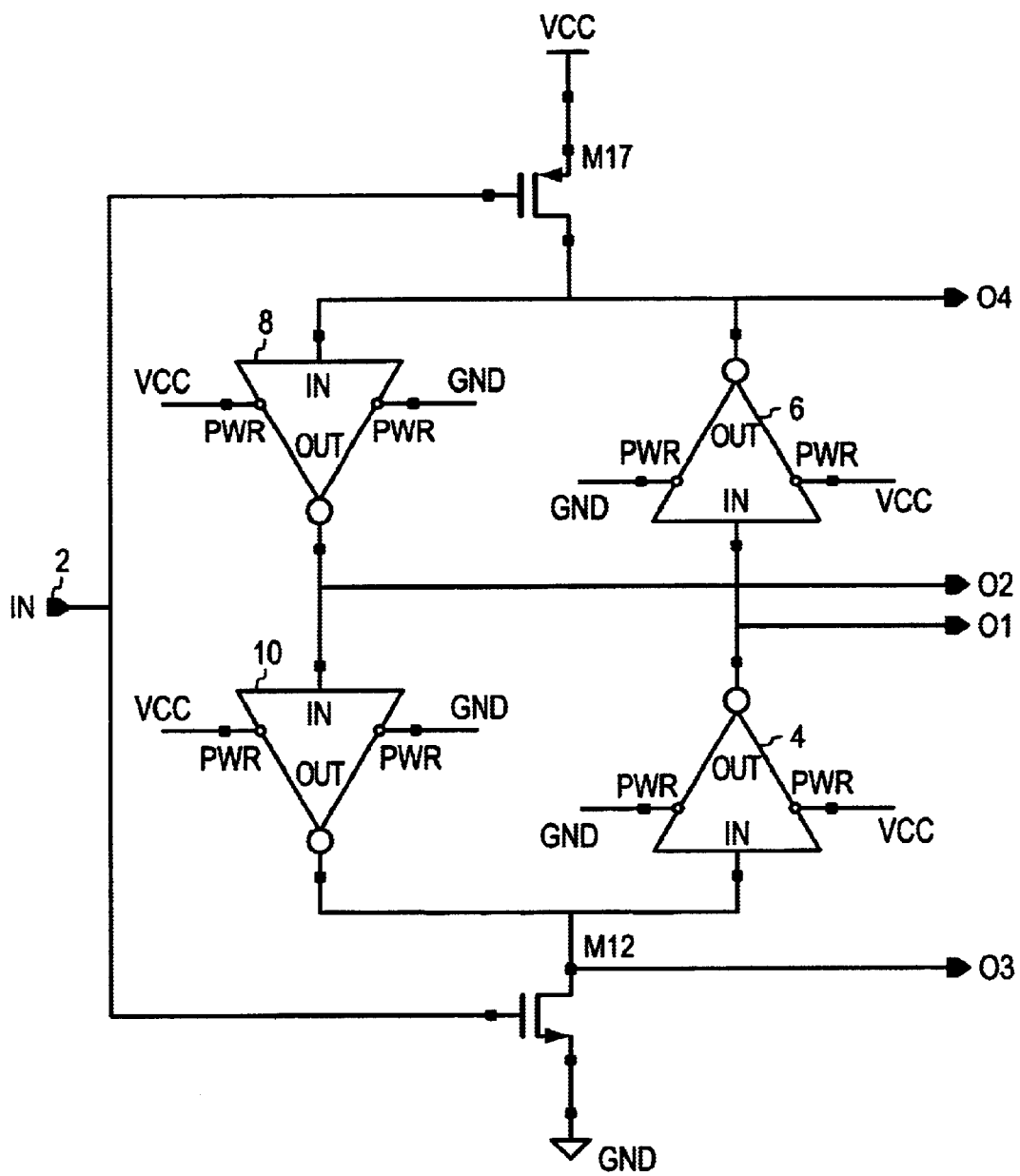
FIG. 1 is a basic circuit incorporating a preferred embodiment of the present invention.

FIG. 1 is a circuit diagram of one circuit that illustrates the present invention. There is an input signal 2, and two output signals O1 and O2, both arranged non-inverting with respect to the input signal 2.

If the input signal 2 is high, CMOS M17 is off and M12 is on driving the signal O3 low that, in turn, drives the output O1 high via inverter 4. The signal O4 is driven low through the inverter 6. This is allowed since CMOS M17 is off. The output O2 is high via the inverter 8, and the inverter 10 drives O3 low. Since O3 was already low by M12 being on, the action of the inverter 10 latches the circuit maintaining the outputs O1 and O2 high. That is, M12 could be removed or turned off and the outputs O1 and O2 will remain high.

When the input 2 goes low, M12 is turned off, and M17 is turned on. M17 is designed with respect to the inverter 6 (that was driving O4 low) such that M17 overcomes the inverter and drives O4 high. This high drives O2 low via inverter 8. The action then continues with O3 driven high via inverter 10 (since M12 is off). Output O1 is then driven low via inverter 4. This low at O1 drives O4 high via inverter 6 again latching the circuit in a stable state with outputs O1 and O2 low.

With respect to the above sequence, it is important to note the output O1 goes high before O2, but that O2 goes low before O1. In this case O1 completely envelops O2 for positive going inputs. Notice that this is guaranteed since there are necessarily two inverter delays between the described transitions.

The operation of the circuit in FIG. 1 may be described as the CMOS transistors M12 and M17 directing or gating the input signal to alternating inverter chains. O1 is driven positive first via inverter 4 that then drives O2 positive via inverter chain 6 and 8. Inverter 10 then latches as described above. That latch holds the state when the input goes low where M17 turns on and drives O2 low via inverter 8 while O1 remains high. The low going O2 via inverter chain 10 and 4 drives O1 low. Thus O1 envelops O2 for positive going pulses.

Inherently, by the same operation described above, output O2 envelops O1 for negative going pulses.

Figure 2:
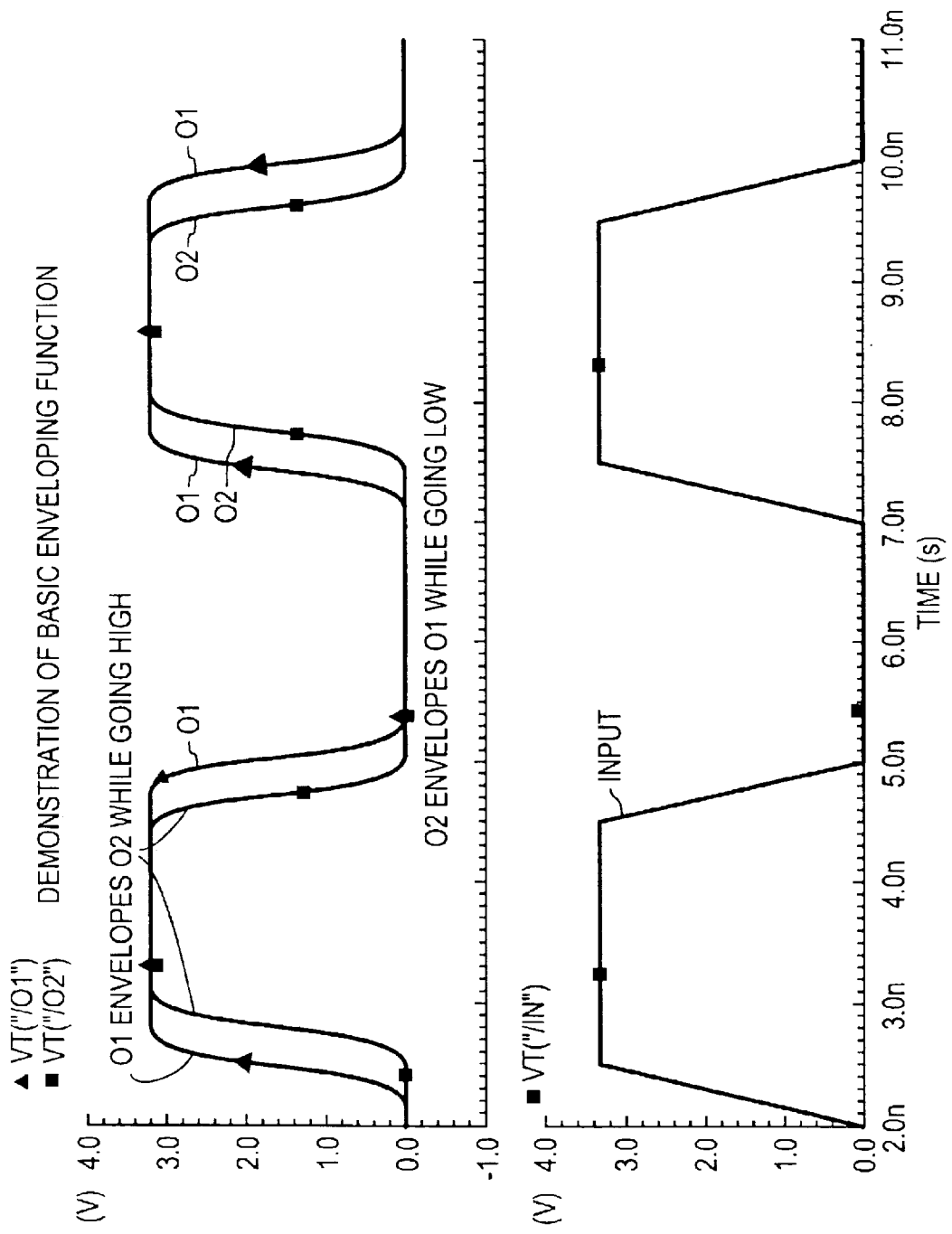
FIG. 2 is a timing diagram of associated with the circuit of FIG. 1.

As is well known in the art, the CMOS transistors and inverters can be designed to tune or control the delays with respect to the enveloping curve and the enveloped curve. That is, the delays between the curves and the slew rate of the curves can be controlled. FIG. 2 shows relative signals O1 and O2 with respect to the input signal.

Since alternative inverter chains are used to switch the outputs when the input signal makes a transition, the transition of the delayed output edge (either O1 or O2) is derived from the transition of the leading output edge after at least two inverter delays. This two inverter delay occurs as a circuit artifact regardless of processing techniques, voltages used, and/or temperature variations, found in practice.

The circuits shown in FIGS. 3, 4, 5 and 6 show variations of the basic circuit of FIG. 1.

Figure 3:
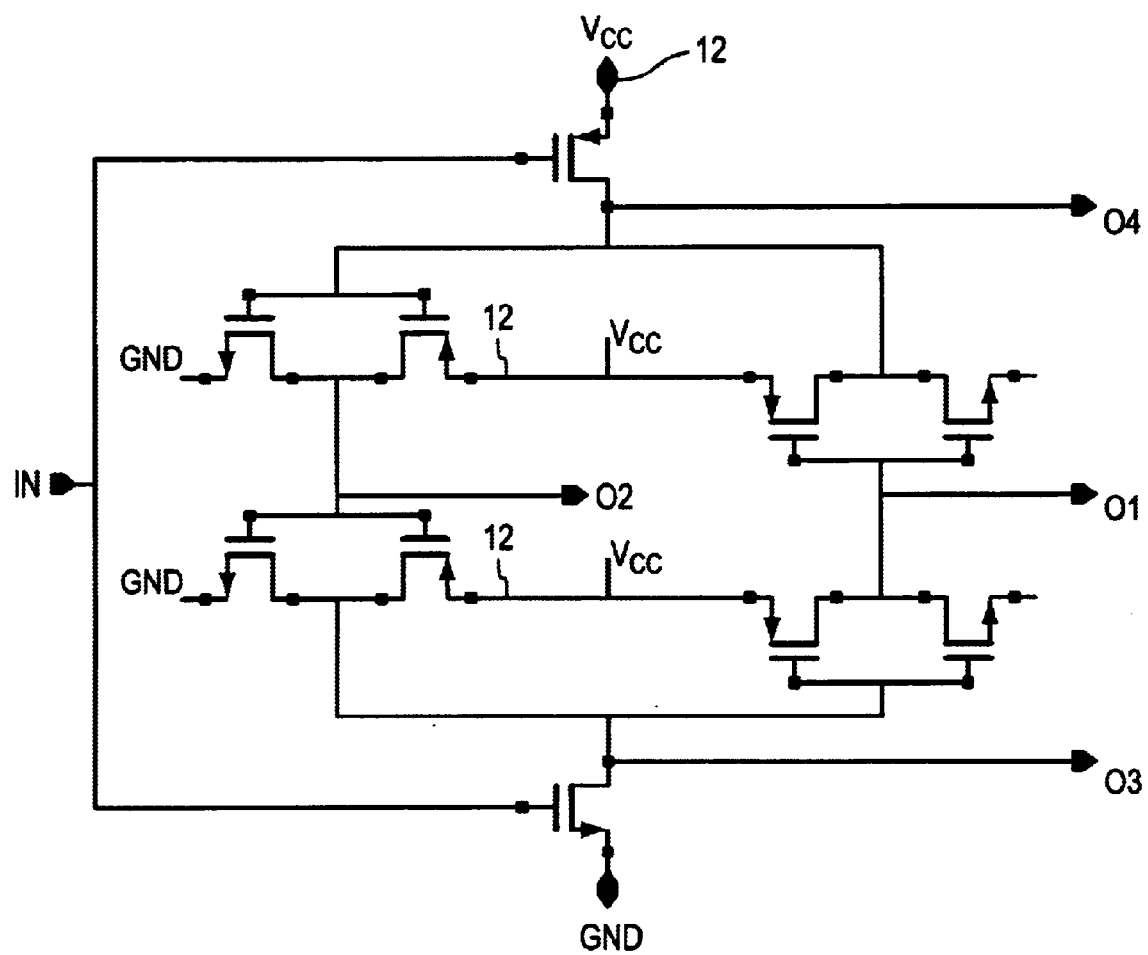
FIGS. 3, 4, 5 and 6 are other preferred embodiments of the present invention.

FIG. 3 shows each of the inverters replaced by a stacked CMOS pair. In this instance logical operation is the same as described from the circuit in FIG. 1, but with the added benefit that there will be no static current drain from the Vcc power rail 12.

Figure 4:
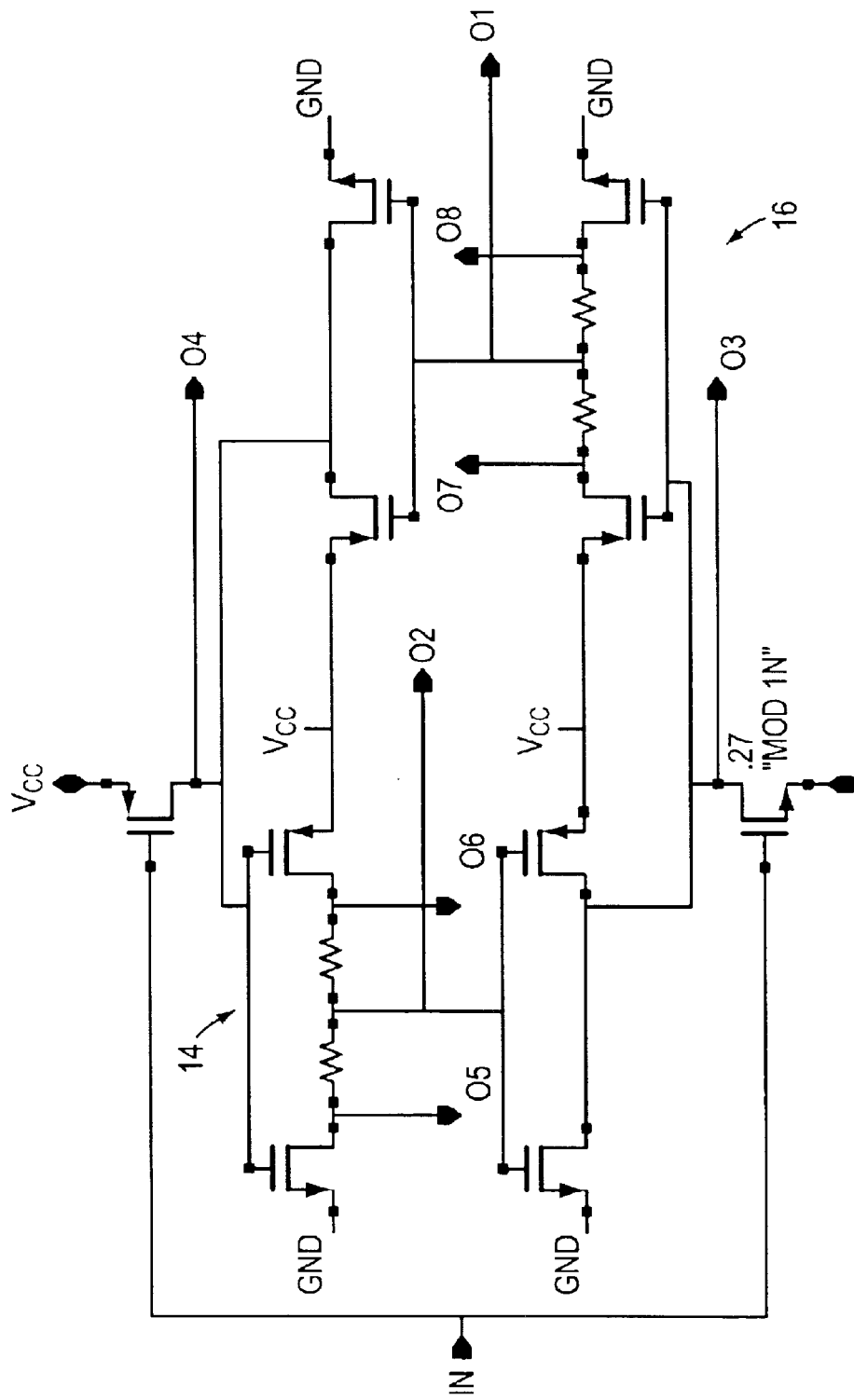

FIG. 4 shows the circuit of FIG. 3 with resistors added to the output lines in inverter 14 and 16. These resistors can be used to trim the rise and fall times and therefore the delays of the circuitry. The resistors could be channel resistances as well as other diffused or deposited resistances. The different types will be available to circuit designers for particular applications.

Figure 5:
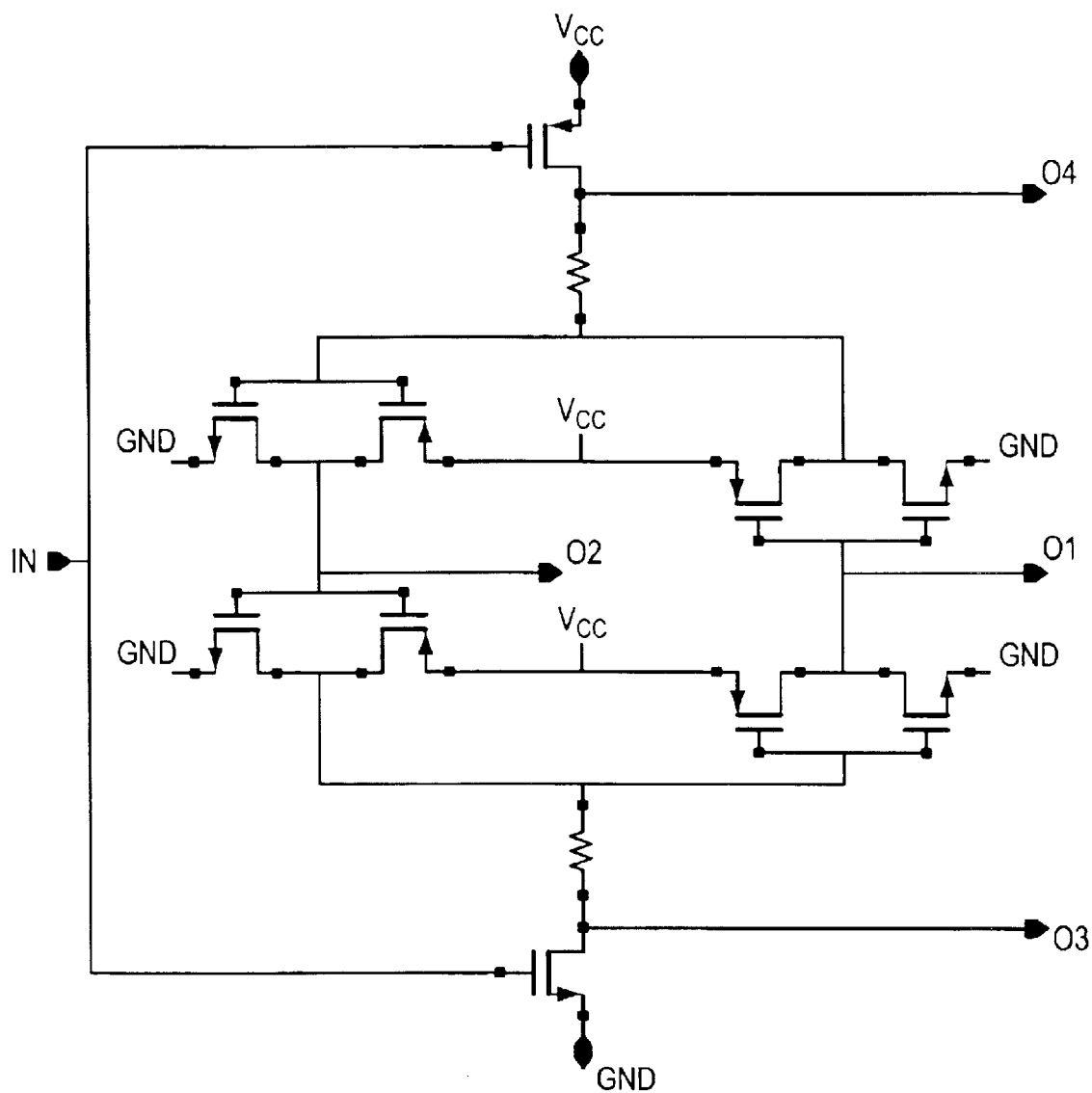
Figure 6:
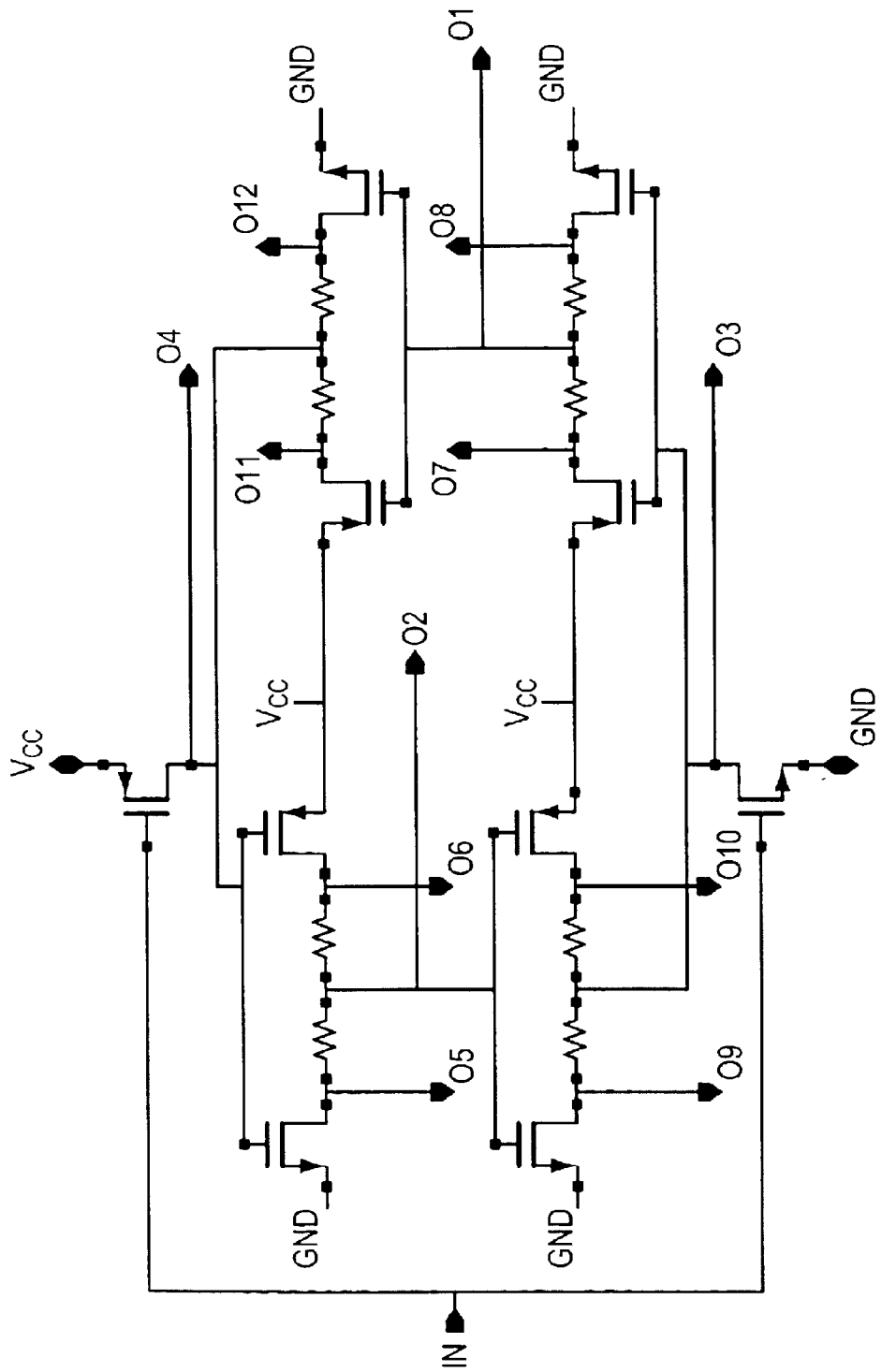

FIG. 5 includes resistances in the drains of M12 and M17 and FIG. 6 shows the circuitry of FIG. 3 with resistance in all four inverter circuits.

As known to practitioners in the field, the sizes of the resistors may be determined with respect to specific applications, typically for setting delay times. In some preferred embodiments the values range from 50 to 1 K ohms but other values may be used to advantage. Additionally, capacitors are inherent in the any practical embodiment of the present invention. These capacitors together with the resistors contribute to the delays discussed above, and additional capacitances may be added for particular applications. Such capacitances may be implemented with reverse biased pn junctions or integrated circuit effective parallel plate capacitors, or discrete capacitors as is well known in the art.

It will be apparent to circuit designers that the circuit of FIG. 1 can be embodied in many different configurations while retaining the characteristics that ensure one signal envelops another. For example the inverters may be replaced by logic gates, NAND's, NOR's, etc, or active FET's or bipolar components, etc. performing similar operations as described herein.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. An enveloping curve generator comprising:
   an input signal,
   a first output signal and a second output signal,
   a first steering circuit that direct the input signal to a first node when the input signal goes high, and a second steering circuit that directs the input signal to a second node when the input signal goes low,
   a latch circuit connected to the first and the second nodes, and wherein the latch circuit provides a first output and a second output, and wherein when the input goes high the latch circuit decouples the second steering circuit and via the first steering circuit—drives the first output high,
   when the input goes low, the latch circuit decouples the first steering circuit and via the second steering circuit drives the second output low, and the second output going low drives the first output low, wherein
   the first output goes high before the second output goes high and the first output goes low after the second output goes low, so that the first output envelops the second output when both go high and the second envelops the first output when both go low.

2. The enveloping circuit of claim 1 wherein the latch circuit comprises:
   a first inverter with its input connected to the first node and its output connected to the first output,
   a second inverter with its input connected to the first output and its output connected to the second node,
   a third inverter with its input connected to the second node and its output connected to the second output,
   a fourth inverter with its input connected to the second output and it output connected to the first node.

3. The enveloping circuit of claim 2 wherein the second and third inverters comprise a first delay circuit and the fourth and first inverters comprise a second delay circuit.

4. The enveloping circuit of claim 2, further comprising at least one resistor only through which the output of at least one inverter travels.

5. The enveloping circuit of claim 2 further comprising four resistors only through which each of the outputs of the four inverters travel.

6. The enveloping circuit of claim 2 further comprising a resistor joining the steering circuits to the respective first and second nodes.

7. The enveloping circuit of claim 1 wherein the steering circuits comprise:
   a first NMOS with its gate connected to the input, wherein when the input goes low the NMOS is off, and when the input goes high the NMOS turns on and connects the first node to ground, and
   a second PMOS with its gate connected to the input, wherein when the input goes high the PMOS is off, and when the input goes low the PMOS turns on and connects the second node to a positive voltage, and wherein when the first node goes low the latch circuit is driven so that the two outputs are high, and when the second node is driven high, the latch circuit is driven so that the two outputs are low.

* * * * *